United States Patent
Chu et al.

(10) Patent No.: US 8,921,204 B2
(45) Date of Patent: Dec. 30, 2014

(54) METHOD FOR FABRICATING SEMICONDUCTOR DICE BY SEPARATING A SUBSTRATE FROM SEMICONDUCTOR STRUCTURES USING MULTIPLE LASER PULSES

(71) Applicant: SemiLEDS Optoelectronics Co., Ltd., Chu-nan (TW)

(72) Inventors: Chen-Fu Chu, Hsinchu (TW); Hao-Chung Cheng, Zhubei (TW); Trung Tri Doan, Baoshan Township (TW); Feng-Hsu Fan, Jhonghe (TW)

(73) Assignee: SemiLEDS Optoelectronics Co., Ltd., Chu-nan (TW)

( * ) Notice: Subject to any disclaimer, the term of this patent is extended or adjusted under 35 U.S.C. 154(b) by 0 days.

(21) Appl. No.: 13/936,337

(22) Filed: Jul. 8, 2013

(65) Prior Publication Data

US 2013/0302926 A1    Nov. 14, 2013

Related U.S. Application Data

(63) Continuation-in-part of application No. 11/548,624, filed on Oct. 11, 2006, now Pat. No. 8,507,302.

(51) Int. Cl.
*H01L 21/784* (2006.01)
*H01L 33/00* (2010.01)
*H01L 21/782* (2006.01)
*H01L 33/44* (2010.01)
*H01L 33/46* (2010.01)

(52) U.S. Cl.
CPC .......... *H01L 21/782* (2013.01); *H01L 33/0095* (2013.01); *H01L 33/44* (2013.01); *H01L 33/0079* (2013.01); *H01L 33/46* (2013.01)
USPC ............................ 438/460; 438/432; 438/434

(58) Field of Classification Search
CPC ........... H01L 2221/68327; H01L 2221/68354; H01L 2221/68381
USPC .................................. 438/460, 462, 464, 977
See application file for complete search history.

(56) References Cited

U.S. PATENT DOCUMENTS 5,300,788 A    4/1994    Fan et al.
5,453,405 A    9/1995    Fan et al.
(Continued)

OTHER PUBLICATIONS

U.S. Appl. No. 11/548,624, filed Oct. 11, 2006, entitled "Wall Structures for a Semiconductor Wafer", pp. 1-43N.

(Continued)

*Primary Examiner* — George Fourson, III
(74) *Attorney, Agent, or Firm* — Stephen A. Gratton (57) ABSTRACT

A method for fabricating semiconductor dice includes the steps of providing a wafer assembly having a substrate and semiconductor structures on the substrate; and defining the semiconductor dice on the substrate. The method also includes the step of separating the substrate from the semiconductor structures by applying a first laser pulse to each semiconductor die on the substrate having first parameters selected to break an interface between the substrate and the semiconductor structures and then applying a second laser pulse to each semiconductor die on the substrate having second parameters selected to complete separation of the substrate from the semiconductor structures. The method can also include the steps of forming one or more intermediate structures between the semiconductor dice on the substrate configured to protect the semiconductor dice during the separating step.

26 Claims, 5 Drawing Sheets

(56) References Cited

U.S. PATENT DOCUMENTS

| | | | |
|---|---|---|---|
| 5,552,345 A * | 9/1996 | Schrantz et al. | 438/460 |
| 5,753,940 A | 5/1998 | Komoto | |
| 6,033,927 A | 3/2000 | Shibata et al. | |
| 6,403,985 B1 | 6/2002 | Fan et al. | |
| 7,157,352 B2 * | 1/2007 | Yamanaka | 438/458 |
| 7,521,335 B2 * | 4/2009 | Yamanaka | 438/458 |
| 7,569,865 B2 * | 8/2009 | Lee et al. | 257/99 |
| 7,754,511 B2 | 7/2010 | Wen et al. | |
| 7,955,951 B2 * | 6/2011 | Yan et al. | 438/458 |
| 2005/0227455 A1 | 10/2005 | Park et al. | |
| 2006/0006554 A1 | 1/2006 | Yoo et al. | |
| 2006/0043384 A1 | 3/2006 | Cho et al. | |
| 2006/0057782 A1 * | 3/2006 | Gardes et al. | 438/125 |

OTHER PUBLICATIONS

U.S. Appl. No. 11/548,624, Non-Final Office Action dated Sep. 24, 2008, pp. 1-5.
U.S. Appl. No. 11/548,624, Final Office Action dated Jul. 21, 2009, pp. 1-4.
U.S. Appl. No. 11/548,624, Notice of Allowance dated Mar. 22, 2010, pp. 1-5.
U.S. Appl. No. 11/548,624, Notice of Allowance dated Sep. 29, 2010, pp. 1-5.
U.S. Appl. No. 11/548,624, Non-Final Office Action dated Dec. 14, 2011, pp. 1-6.
U.S. Appl. No. 11/548,624, Non-Final Office Action dated Aug. 8, 2012, pp. 1-5.
U.S. Appl. No. 11/548,624, Notice of Allowance dated Apr. 12, 2013, pp. 1-6.

* cited by examiner

METHOD FOR FABRICATING SEMICONDUCTOR DICE BY SEPARATING A SUBSTRATE FROM SEMICONDUCTOR STRUCTURES USING MULTIPLE LASER PULSES

CROSS REFERENCE TO RELATED APPLICATIONS

This application is a continuation-in-part of Ser. No. 11/548,624, filed Oct. 11, 2006, which is incorporated herein by reference.

BACKGROUND

This disclosure relates generally to the fabrication of semiconductor dice, such as vertical light emitting diode (VLED) dice, and to a method for fabricating semiconductor dice by separating a substrate from semiconductor structures using multiple laser pulses.

Semiconductor dice can include semiconductor structures made of different layers of compound semiconductor materials. For example, one type of semiconductor die, known as a vertical light emitting diode (VLED) die, includes a semiconductor structure in the form of an epitaxial stack comprised of a p-type confinement layer, an n-type confinement layer, and an active layer (multiple quantum well (MQW) layer) between the confinement layers configured to emit light. The semiconductor structure can be fabricated on a carrier substrate that is a component of a wafer assembly containing multiple semiconductor dice. During the fabrication process, the carrier substrate can be separated from the semiconductor structures and other components, such as electrodes, metallization layers and bases can be formed on the dice contained on the wafer assembly. The wafer assembly can then be singulated into the individual dice.

Separation of the carrier substrate from the semiconductor structures contained on the wafer assembly can be performed using a laser, an etching process, a grinding process or chemical mechanical planarization (CMP). One problem occurring during the separation process is that the semiconductor structures can be damaged by the forces applied to separate the carrier substrate. For example, cracking and peeling of the semiconductor structures can occur due to the energy applied by a laser, an etchant, a grinder or by a CMP apparatus used to separate the carrier substrate.

The present disclosure is directed to a method for fabricating semiconductor dice that minimizes damage to the semiconductor structures during the separation of a substrate from semiconductor structures.

SUMMARY

A method for fabricating semiconductor dice includes the steps of: providing a wafer assembly including a substrate and a plurality of semiconductor structures on the substrate; defining the semiconductor dice on the substrate with each die comprising a semiconductor structure; separating the substrate from the semiconductor structures by applying a first laser pulse and a second laser pulse to each semiconductor die on the substrate, with the first laser pulse applied to a first area of the substrate proximate to a targeted die and the second laser pulse applied to a second area of the substrate proximate to the targeted die; and then singulating the wafer assembly. Preferably the first area is greater than or equal to or less than an area of the targeted die, and the second area is less than or equal to the area of the targeted die. The method can also include the steps of forming one or more intermediate structures between the semiconductor dice on the substrate configured to protect the semiconductor dice during the separating step.

The first laser pulse and the second laser pulse can be applied to each semiconductor die on the wafer assembly in succession. In addition, the parameters (e.g., area, power, duration) of the first laser pulse can be selected to apply enough energy to the substrate and the semiconductor structures to break or ablate the interface or linkage between the substrate and the semiconductor structures. The parameters (e.g., area, power, duration) of the second laser pulse can be selected to apply enough energy to the substrate and the semiconductor structures to complete the separation of the substrate from the semiconductor structures. In addition, the first laser pulse can comprise a plurality of laser pulses and the second laser pulse can comprise a plurality of second laser pulses.

DETAILED DESCRIPTION

Referring to FIGS. 1A-1D, steps are illustrated in a method for fabricating semiconductor dice by separating a substrate from semiconductor structures using multiple laser pulses. In the illustrative embodiment the dice comprise vertical light emitting diode (VLED) dice. However, the method can also be used to fabricate other types of semiconductor dice.

Figure 1A:
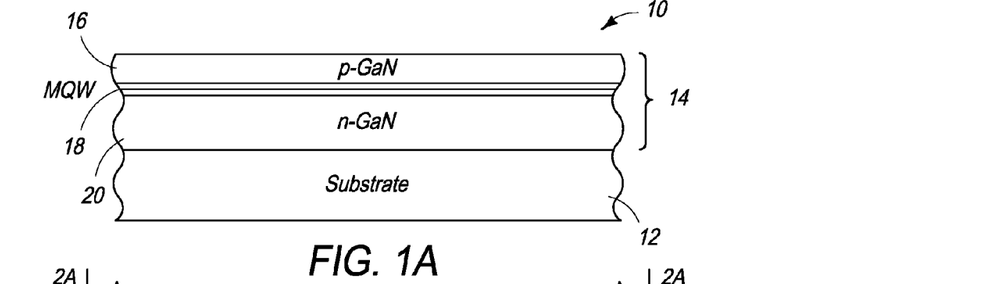
FIGS. 1A-1D are schematic cross sectional views of a wafer assembly having a substrate and semiconductor structures illustrating steps in a method for fabricating semiconductor dice by separating the substrate from the semiconductor structures using multiple laser pulses.

Initially, as shown in FIG. 1A, a wafer assembly 10 comprising a carrier substrate 12 and a plurality of semiconductor structures 14 can be provided. The carrier substrate 12 can be in the form of a wafer comprised of a suitable material, such as sapphire, silicon carbide (SiC), silicon (Si), germanium (Ge), zinc oxide (ZnO), gallium nitride (GaN), aluminum nitride (AlN), zinc selenium (ZnSe) and gallium arsenide (GaAs).

As shown in FIG. 1A, each semiconductor structure 14 comprises a multi layer epitaxial stack formed on the carrier substrate 12. Each semiconductor structure 14 includes a p-type confinement layer 16 (first-type confinement layer), an active layer 18 on the p-type confinement layer 16 configured to emit light (designated MQW in FIGS. 1A-1D), and an n-type confinement layer 20 (second-type confinement layer) on the active layer 18. All of these layers can be fabricated using a suitable deposition process such as vapor phase epitaxy (VPE), metal organic chemical vapor deposition (MOCVD), molecular beam epitaxy (MBE) or liquid phase epitaxy (LPE). In the illustrative embodiment, the p-type confinement layer 16 comprises p-GaN and the n-type layer 20 comprises n-GaN. Rather than GaN, the p-type confinement layer 16 and the n-type layers 20 can comprise various other compound semiconductor materials, such as AlGaN, InGaN, and AlInGaN. The active layer 18 can be formed of suitable materials such as an InGaN layer sandwiched between two layers of a material with a wider bandgap such as GaN.

Figure 1B:
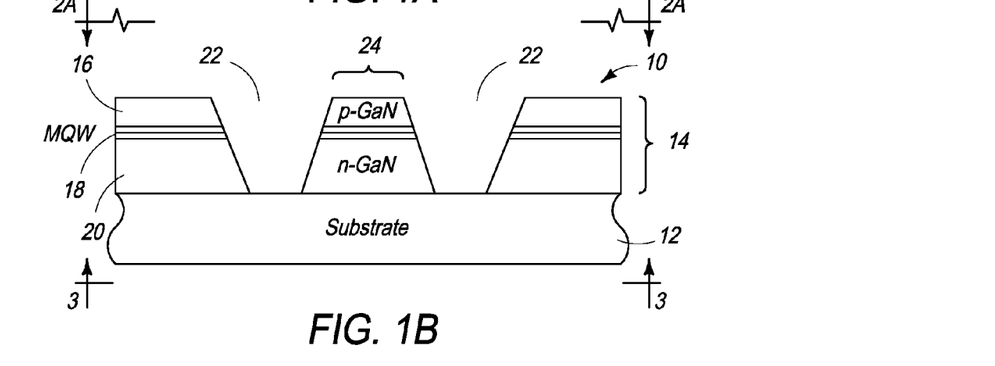
Figure 2A:
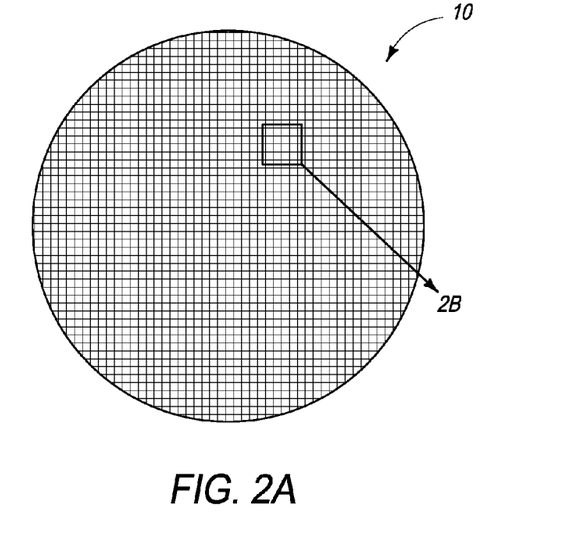
FIG. 2A is a schematic plan view taken along line 2A-2A of FIG. 1B but extended to show the entire wafer assembly illustrating the semiconductor dice on the wafer assembly defined by trenches in the semiconductor structures.
Figure 2B:
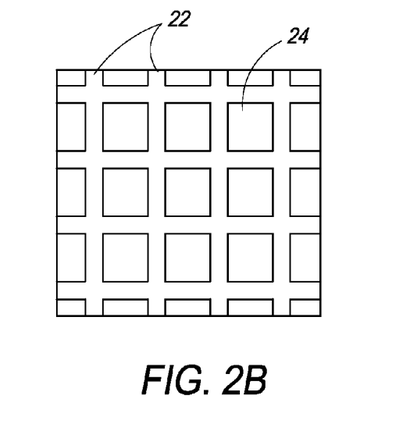
FIG. 2B is an enlarged portion of FIG. 2A taken along line 2B illustrating the semiconductor dice and the trenches.
Figure 3:
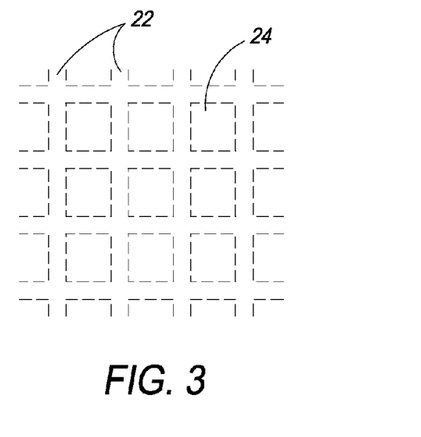
FIG. 3 is a schematic bottom view taken along line 3-3 of FIG. 1B illustrating the peripheral outline of the semiconductor dice as defined by the trenches.

Next as shown in FIG. 1B, a suitable process can be used to form trenches 22 through the semiconductor structures 14. The trenches 22 can endpoint on the carrier substrate 12 as shown, or alternately as will be further explained, the trenches 22 can extend a selected depth into the carrier substrate 12. In addition, prior to forming the trenches 22, other elements of the semiconductor structures 14 such as reflector layers (not shown) can be formed as required. As shown in FIGS. 2A and 2B, the trenches 22 can be formed in a criss-cross pattern similar to the streets between dice in a conventional semiconductor fabrication process, such that a plurality of defined dice 24 are formed. A suitable process for forming the trenches 22 comprises dry etching through a hard mask. Other suitable processes include laser cutting, saw cutting, diamond cutting, wet etching, dry etching and water jetting. As shown in FIG. 3, each die 24 has a peripheral area or outline, which can be of any geometric shape (e.g., square, rectangular, circular) and size. In addition, the trenches 22, which are equivalent to the streets on a semiconductor wafer in semiconductor fabrication, define the peripheral outline of the dice 24. The trenches 22 can also have a selected size and shape and are shown with sloped sidewalls as would occur with an etching process. Dimensions of the trenches 22 are provided in parent application Ser. No. 11/548,624.

Figure 1C:
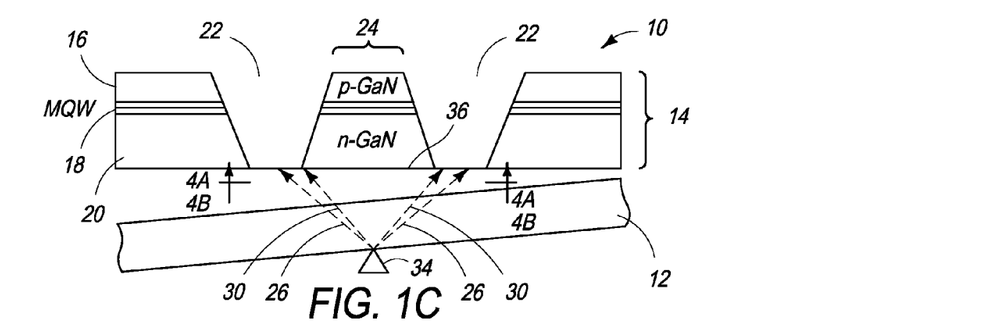
Figure 4A:
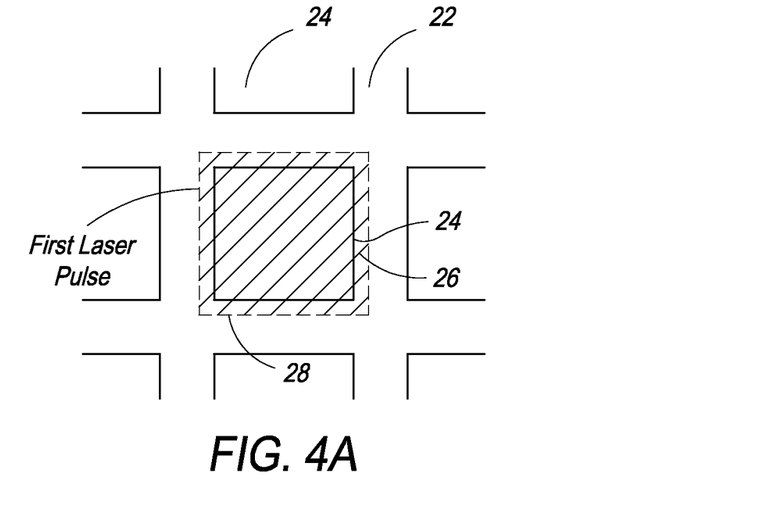
FIGS. 4A and 4B are schematic cross sectional views taken along lines 4A-4A and 4B-4B of FIG. 1C, respectively, illustrating multiple laser pulses for separating he substrate from the semiconductor structures.
Figure 4B:
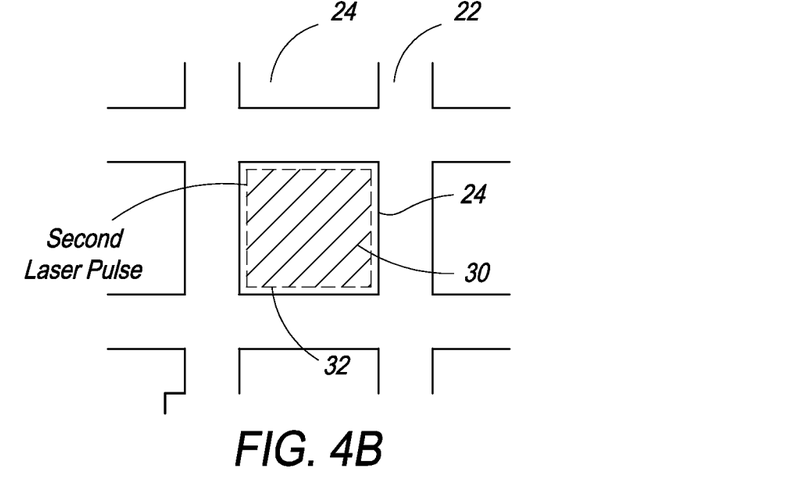

Next as shown in FIG. 1C, the carrier substrate 12 can be removed from the n-type confinement layer 20 using a pulse laser irradiation process in which a first laser pulse 26 is applied to a first area 28 (FIG. 4) of the substrate 12 and a second laser pulse 30 is applied to a second area 32 (FIG. 4) of the substrate 12 proximate to each semiconductor die 24. The first laser pulse 26 and the second laser pulse 30 can be applied to each semiconductor die 24 in succession. In addition, the first laser pulse 26 can comprise a single laser pulse or a plurality of laser pulses configured to apply a selected amount of energy to the substrate 12 during the separation process. For example, the parameters (e.g., area, power, duration) of the first laser pulse 26 can be selected to apply enough energy to the substrate 12 and the semiconductor structures 14 to ablate or melt the interface 36 between the substrate 12 and the semiconductor structures 14 for each semiconductor die 24. Similarly, the second laser pulse 30 can comprise a single laser pulse or a plurality of laser pulses configured to apply a selected amount of energy to the substrate 12 for completing the separation process. For example, the parameters (e.g., area, power, duration) of the second laser pulse 30 can be selected to apply enough energy to the substrate 12 and the semiconductor structures 14 to complete the separation of the substrate 12 from the semiconductor structures 14.

The pulse laser irradiation process can be performed using a variety of conventional laser systems used in the art. For example, a laser system 34 (FIG. 1C) can include a YAG laser source configured to produce the laser pulses 26, 30. The laser system 34 can also include an expander configured to expand the laser pulses 26, 30, a lens system having a focusing device configured to focus the laser pulses 26, 30 onto the substrate 12, and a wafer handler configured to align and move the wafer assembly 10 past the laser pulses 26, 30 to successively align each semiconductor die 24 with the laser pulses 26, 30. The operational parameters of the laser system 34 can be selected as required. In general, these parameters are selected such that the interface 36 between the GaN semiconductor material of the semiconductor structures 14 and the substrate 12 is ablated. This allows the substrate 12 to be separated from the semiconductor structures 14 by gravity or application of a light mechanical force.

As shown in FIG. 4A, the first laser pulse 26 can be configured such that the first area 28 is greater than the area of the semiconductor die 24 being targeted but without encroaching the area occupied by any adjacent semiconductor dice 24. In other words, the area (ALP1) of the first laser pulse 26 can be greater than the area (AD) of the semiconductor die 24. Alternately, the area (ALP1) of the first laser pulse 26 can be less than the area (AD) of the semiconductor die 24. As yet another alternative, the area (ALP1) of the first laser pulse 26 can be equal to the area (AD) of the semiconductor die 24. Stated mathematically ALP1>AD, or ALP1<AD or ALP1=AD. In any case, the first laser pulse 26 preferably does not encroach upon any area occupied by any adjacent semiconductor dice 24.

As shown in FIG. 4B, the second laser pulse 30 can be configured such that the second area 32 is less than or equal to the area of the semiconductor die 24 being targeted. In other words, the area (ALP2) of the second laser pulse 30 can be less than or equal to the area (AD) of the semiconductor die 24. Stated mathematically ALP2<AD or ALP2=AD.

Figure 1D:
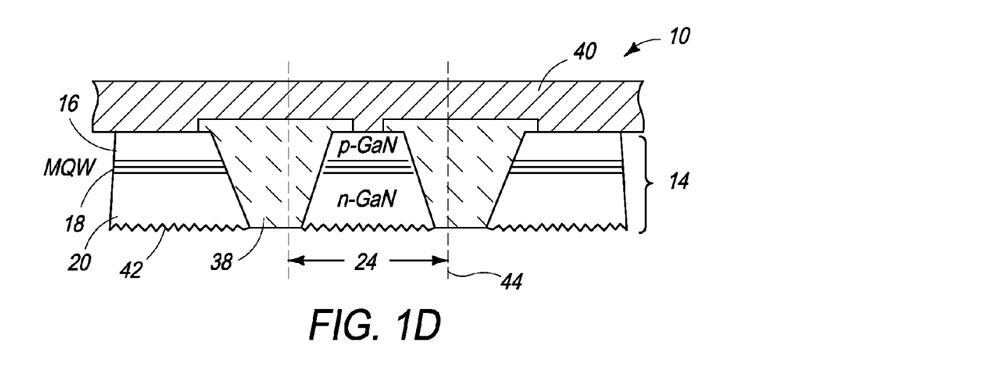

As shown in FIG. 1D, either before or after the separation process additional process steps can be performed to form additional elements on the semiconductor dice 24. For example, a non-conductive material 38 can be formed in the trenches 22 and on the sidewalls of the semiconductor structures 14 to protect the structures 14 during the separation process. In addition, a conductive base 40 can be formed on the non-conductive material as a component of a vertical light emitting diode (VLED) die. Formation of the non-conductive material 38 and the conductive base 40 are further described in parent application Ser. No. 11/548,624.

As also shown in FIG. 1D, following the separation process, a roughened surface 42 can be formed on the outer surface of the n-type confinement layer 20 using a roughening (or texturing) process. One process for roughening the outer surfaces of the n-type confinement layer 20 combines photoelectrochemical oxidation and etching. This process is described in US. Pat. Nos. 7,186,580 B2; 7,473,936 B2; 7,524,686 B2; 7,563,625 B2 and 7,629,195 B2, which are incorporated herein by reference.

As also shown in FIG. 1D, following completion of these processes, the wafer assembly 10 can be singulated along dicing lines 44 into individual semiconductor dice 24. The singulation process can be performed using a process such as lasering, sawing, water jetting or etching.

Figure 5A:
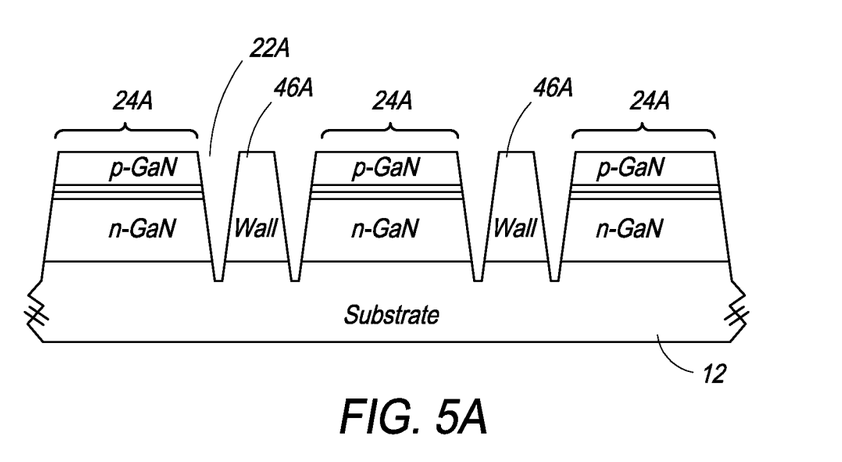
FIG. 5A is a schematic cross sectional views equivalent to FIG. 1B illustrating an alternate embodiment of the method wherein intermediate structures are formed between adjacent semiconductor dice.

Referring to FIG. 5A, the method can alternately be performed by forming intermediate structures 46A between the adjacent semiconductor dice 24A. For example, the intermediate structures 46A can comprise walls as described in parent application Ser. No. 11/548,624, which are configured to protect the semiconductor dice 24A during the separation process. In addition, the trenches 22A can extend into the substrate 12 by a selected depth as described in parent application Ser. No. 11/548,624.

Figure 5B:
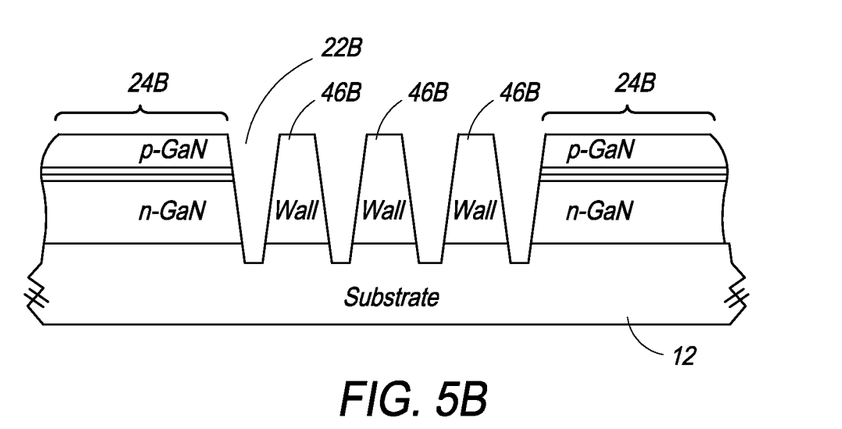
FIG. 5B is a schematic cross sectional views equivalent to FIG. 1B illustrating an alternate embodiment of the method wherein a plurality of intermediate structures are formed between adjacent semiconductor dice.

Referring to FIG. 5B, the method can alternately be performed by forming a plurality of intermediate structures 46B between the adjacent semiconductor dice 24B. For example, the intermediate structures 46B can comprise walls as described in parent application Ser. No. 11/548,624, which are configured to protect the semiconductor dice 24A during the separation process. In addition, the trenches 22B can extend into the substrate 12 by a selected depth as described in parent application Ser. No. 11/548,624.

Figure 6A:
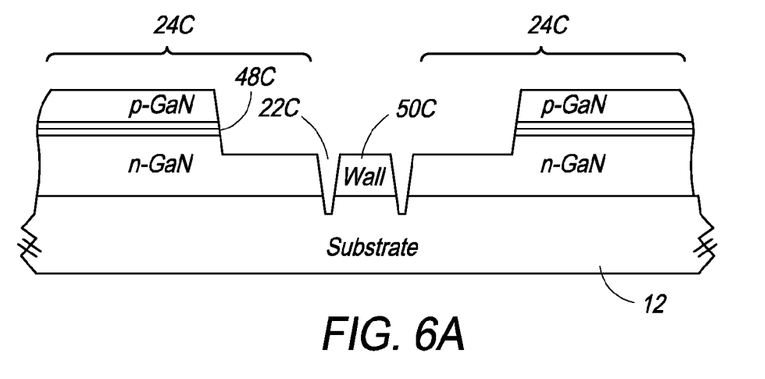
FIG. 6A is a schematic cross sectional views equivalent to FIG. 1B illustrating an alternate embodiment of the method wherein intermediate structures are formed in a mesa between adjacent semiconductor dice.

Referring to FIG. 6A, the method can alternately be performed by forming a mesa 48C and intermediate structures 50C between the adjacent semiconductor dice 24C. For example, the intermediate structures 50C can comprise walls as described in parent application Ser. No. 11/548,624, which are configured to protect the semiconductor dice 24A during the separation process. In addition, the trenches 22C can extend into the substrate 12 by a selected depth as described in parent application Ser. No. 11/548,624.

Figure 6B:
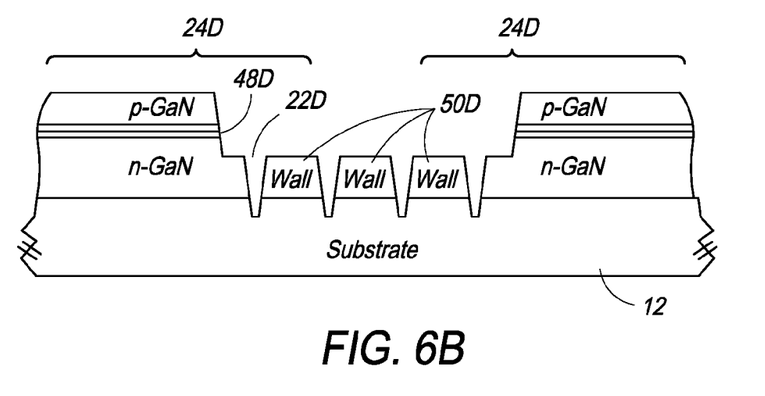
FIG. 6B is a schematic cross sectional views equivalent to FIG. 1B illustrating an alternate embodiment of the method wherein a plurality of intermediate structures are formed in a mesa between adjacent semiconductor dice.

Referring to FIG. 6B, the method can alternately be performed by forming a mesa 48D and a plurality of intermediate structures 50D between the adjacent semiconductor dice 24D. For example, the intermediate structures 50D can comprise walls as described in parent application Ser. No. 11/548,624, which are configured to protect the semiconductor dice 24D during the separation process. In addition, the trenches 22D can extend into the substrate 12 by a selected depth as described in parent application Ser. No. 11/548,624.

Thus the disclosure describes an improved method for fabricating semiconductor dice. While a number of exemplary aspects and embodiments have been discussed above, those of skill in the art will recognize certain modifications, permutations, additions and subcombinations thereof. It is therefore intended that the following appended claims and claims hereafter introduced are interpreted to include all such modifications, permutations, additions and sub-combinations as are within their true spirit and scope.

What is claimed is:

1. A method for fabricating semiconductor dice comprising:
   providing a wafer assembly comprising a substrate and a plurality of semiconductor structures on the substrate;
   defining the semiconductor dice on the substrate with each semiconductor die comprising a semiconductor structure;
   separating the substrate from the semiconductor structures by applying a first laser pulse and a second laser pulse to each semiconductor die on the substrate, with the first laser pulse applied to a first area of the substrate proximate to a targeted die and the second laser pulse applied to a second area of the substrate proximate to the targeted die; and
   singulating the wafer assembly.

2. The method of claim 1 further comprising forming one or more intermediate structures between the semiconductor dice on the substrate prior to the separating step.

3. The method of claim 1 wherein the first laser pulse comprises a plurality of first laser pulses.

4. The method of claim 1 wherein the second laser pulse comprises a plurality of second laser pulses.

5. The method of claim 1 wherein parameters of the first laser pulse are selected to apply enough energy to the substrate and the semiconductor structures to break the interface between the substrate and the semiconductor structures.

6. The method of claim 1 wherein parameters of the second laser pulse are selected to apply enough energy to the substrate and the semiconductor structures to complete separation of the substrate from the semiconductor structures.

7. The method of claim 1 wherein the first area is greater than the area of the targeted die.

8. The method of claim 1 wherein the first area is less than the area of the targeted die.

9. The method of claim 1 wherein the first area is equal to an area of the targeted.

10. The method of claim 1 wherein the second area is equal to the area of the targeted die.

11. The method of claim 1 wherein the second area is less than the area of the targeted die.

12. A method for fabricating semiconductor dice comprising:
    providing a wafer assembly comprising a substrate and a plurality of semiconductor structures on the substrate;
    defining the semiconductor dice on the substrate with each semiconductor die comprising a semiconductor structure;
    separating the substrate from the semiconductor structures by applying a first laser pulse to each semiconductor die on the substrate having first parameters selected to break an interface between the substrate and the semiconductor structures and then applying a second laser pulse to each semiconductor die on the substrate having second parameters selected to complete separation of the substrate from the semiconductor structures, with the first laser pulse applied to a first area of the substrate proximate to a targeted die and the second laser pulse applied to a second area of the substrate proximate to the targeted die; and
    singulating the wafer assembly.

13. The method of claim 12 wherein the semiconductor dice comprise vertical light emitting diode (VLED) dice and the semiconductor structures comprise epitaxial stacks, with each epitaxial stack including a multiple quantum well (MQW) layer configured to emit light and confinement layers on either side of the multiple quantum well (MQW) layer.

14. The method of claim 13 further comprising forming one or more intermediate structures between the semiconductor dice on the substrate prior to the separating step.

15. The method of claim 14 wherein the intermediate structures comprise a wall between each semiconductor die.

16. The method of claim 14 wherein the intermediate structures comprise a plurality of walls between each semiconductor die.

17. The method of claim 14 wherein the intermediate structures comprise a mesa and a wall between each semiconductor die.

18. The method of claim 14 wherein the intermediate structures comprise a mesa and a plurality of walls between each semiconductor die.

19. The method of claim 12 wherein the first area is greater than or equal to or less than an area of the targeted die.

20. The method of claim 12 wherein the second area is less than or equal to the area of the targeted die.

21. A method for fabricating semiconductor dice comprising:
providing a wafer assembly comprising a substrate and a plurality of semiconductor structures on the substrate, each semiconductor structure comprising an epitaxial stack including a multiple quantum well (MQW) layer configured to emit light and confinement layers on either side of the multiple quantum well (MQW) layer;
defining a plurality of vertical light emitting diode (VLED) semiconductor dice on the substrate;
separating the substrate from the semiconductor structures by applying a first laser pulse to each (VLED) semiconductor die on the substrate having first parameters selected to break an interface between the substrate and the semiconductor structures and then applying a second laser pulse to each (VLED) semiconductor die on the substrate having second parameters selected to complete separation of the substrate from the semiconductor structures, with the first laser pulse applied to a first area of the substrate proximate to a targeted die and the second laser pulse applied to a second area of the substrate proximate to the targeted die; and
singulating the wafer assembly.

22. The method of claim 21 wherein the first laser pulse comprises a plurality of first laser pulses and the second laser pulse comprises a plurality of second laser pulses.

23. The method of claim 21 further comprising forming one or more intermediate structures between the semiconductor dice on the substrate prior to the separating step.

24. The method of claim 21 further comprising forming one or more walls between the semiconductor dice on the substrate prior to the separating step.

25. The method of claim 21 wherein the first area is greater than or equal to or less than an area of the targeted die.

26. The method of claim 21 wherein the second area is less than or equal to an area of the targeted die.

* * * * *